United States Patent [19]

Nakagiri et al.

[11] Patent Number: 4,740,829

[45] Date of Patent: Apr. 26, 1988

[54] SEMICONDUCTOR DEVICE HAVING A THIN LAYER COMPRISING GERMANIUM ATOMS AS A MATRIX WITH A RESTRICTED RANGE OF HYDROGEN ATOM CONCENTRATION

[75] Inventors: Takashi Nakagiri; Yutaka Hirai, both of Tokyo; Yoshiyuki Osada, Yokosuka, all of Japan

[73] Assignee: Canon Kabushiki Kaisha, Tokyo, Japan

[21] Appl. No.: 937,432

[22] Filed: Dec. 3, 1986

Related U.S. Application Data

[63] Continuation of Ser. No. 527,385, Aug. 29, 1983, abandoned.

[30] Foreign Application Priority Data

Sep. 2, 1982 [JP] Japan .................... 57-153105
Dec. 29, 1982 [JP] Japan .................... 57-231521

[51] Int. Cl.[4] ........................... H01L 29/04
[52] U.S. Cl. ........................... 357/59; 357/2; 357/4
[58] Field of Search .............. 357/59 B, 59 G, 2, 4, 357/59 R

[56] References Cited

U.S. PATENT DOCUMENTS 3,818,426  6/1974  Bonnet et al. .
4,176,365 11/1979  Kroger ....................... 357/59
4,217,374  8/1980  Ovshinsky et al. ............ 357/2
4,351,856  9/1982  Matsui et al. ................ 357/59
4,409,605 10/1983  Ovshinsky et al. ............ 357/2

OTHER PUBLICATIONS

Bower, et al., "MOS Field Effect Transistors Formed by Gate Masked Ion Implantation", *IEEE on Electron Devices*, vol. ED-15, 10/68, pp. 757-761.

Campbell, "Enhanced Conductivity in Plasma-Hydrogenated Polysilicon Films", *Appl. Phys. Lett*, 36(7), 4/80, pp. 604-606.

Fang, et al., "Making Ion Implanted Self-Aligned FET Using Silicide Metallurgy", *IBM Tech. Discl. Bull.*, vol. 14, No. 12, 5/72, p. 3687.

Kamins, et al., "Hydrogenation of Transistors Fabricated in Poly-Crystalline-Silicon Films", *IEEE Electron Device Letters*, vol. EDL-1, No. 8, 8/80, pp. 159-161.

Seager, et al., "Passivation of Grain Boundaries in Polycrystalline Silicon", *Appl. Phys. Lett*, 34(5), 1/79, pp 337-340.

"MOS Moves Onto High-Speed Track", *U.S. Reports*, 5/69, p. 49.

*Proceeding of the IEEE*, vol. 51, No. 5, 5/63, pp. 851-854.

*Primary Examiner*—Martin H. Edlow
*Attorney, Agent, or Firm*—Fitzpatrick, Cella, Harper & Scinto

[57] ABSTRACT

A semiconductor device comprises a polycrystalline semiconductor thin film layer comprising germanium atoms as a matrix and containing 3 atomic % or less of hydrogen atoms.

11 Claims, 7 Drawing Sheets

SEMICONDUCTOR DEVICE HAVING A THIN LAYER COMPRISING GERMANIUM ATOMS AS A MATRIX WITH A RESTRICTED RANGE OF HYDROGEN ATOM CONCENTRATION

This application is a continuation of application Ser. No. 527,385 filed Aug. 29, 1983, now abandoned.

BACKGROUND OF THE INVENTION

1. Field of the Invention

This invention relates to a semiconductor device such as a field effect transistor, etc., more particularly to a semiconductor device of a main part is constituted of a polycrystalline thin film semiconductor layer containing germanium.

2. Description of the Prior Art

Recently, for providing a scanning circuit portion of an image reading device for use in image reading, such as a one-dimensional photosensor made in a continuous length or a two-dimensional photosensor of an enlarged area, or for providing a driving circuit of an image display device utilizing liquid crystal (abbreviated as LC), electrochromic material (abbreviated as EC), it has been proposed to form a field effect thin film transistor by using as the base material a silicon thin film formed on a certain substrate, corresponding to scale-up of these devices. And, in the prior art, while the effective carrier mobility (hereinafter written as $\mu$eff) required by a scanning circuit portion of a high function reading device or a driving circuit portion of an image display device is about 50 to 100 $cm^2$/V.sec, $\mu$eff of the thin film transistor (TFT) by use of an amorphous silicon thin film is as small as 0.1 $cm^2$/V.sec, and therefore it was not necessarily suitable for providing the above circuit portion. On the other hand, a polycrystalline silicon thin film has a mobility $\mu$eff greater than an amorphous silicon thin film, but in order to respond to the above requirement, an annealing step is required, whereby such problems that the steps become complicated or that no uniform film over a large area could be obtained were involved.

On the other hand, formation of a polycrystalline germanium thin film has been attempted in the prior art according to the vacuum vapor deposition method. The Hall mobility (hereinafter written as $\mu$H) of the film obtained by this method is extremely large, as great as some 100 $cm^2$/V.sec, and its $\mu$eff was also expected to be large. However, in a non-doped polycrystalline germanium thin film there is generally formed a high density acceptor level, and therefore, doping efficiency of an impurity to make a n-type or p-type semiconductor was poor. For this reason, no polycrystalline germanium thin film semiconductor element has been practically used. In other words, because the so called intrinsic semiconductor can be formed only with difficulty, doping efficiency into germanium matrix by addition of an impurity was very bad. Also, in a germanium thin film, there is observed a phenomenon of Thermal Conversion in which conversion from n-type semiconductor to p-type semiconductor occurs by heat treatment, and therefore it was not suitable for device preparation including a heat treatment step. Thus, under the present situation, an element or a device by using as the base material a polycrystalline germanium thin film could not sufficiently exhibit desired characteristics or reliability.

Also, due to smaller energy gap of germanium as compared with silicon, there is involved a drawback of, for example, greater reverse direction saturation current, which may sometimes cause troubles in practical application. Further, as another disadvantage, due to smaller energy gap, the concentration of the carrier raised by heat energy from the valence electron band to the conduction band approaches the concentration of the carrier caused by an impurity at a low temperature, whereby the temperature tolerance range of the device was narrow.

SUMMARY OF THE INVENTION

The present invention has been accomplished in view of the various points as mentioned above, and an object of the present invention is to provide a semiconductor device which is high in device performance and in reliability.

Another object of the present invention is to provide a semiconductor device by use of a polycrystalline thin film containing germanium, which is very small in the impurity level in the forbidden band of a semiconductor, that is very good in doping efficiency of an impurity of p-type or n-type.

Further, it is also an object of the present invention to provide a field effect thin film transistor having high performance, high reliability and high stability, by use of a polycrystalline germanium thin film semiconductor formed on a substrate.

Alternatively, another object of the present invention is to provide a semiconductor device with an enlarged area comprising field effect thin film transistors using excellent polycrystalline germanium thin film semiconductor layers as constituent elements.

Still another object of the present invention is to provide a semiconductor element comprising its main part constituted of a polycrystalline semiconductor layer comprising germanium atoms, optionally together with silicon atoms, as the matrix, containing 3 atomic % or less of hydrogen atoms (hereinafter written as poly-Ge$_x$Si$_{1-x}$:H, where $0 < x \leq 1$).

In accordance with the present invention, there is provided a semiconductor device which comprises a polycrystalline semiconductor thin film layer comprising germanium atoms as a matrix and containing 3 atomic % or less of hydrogen atoms.

DETAILED DESCRIPTION OF THE PREFERRED EMBODIMENTS

The field effect type thin film transistor (TFT) as an example of the semiconductor device prepared using the poly-$Ge_xSi_{1-x}$:H thin film as the base material of the present invention is known as a transistor constituted of a semiconductor layer, an electrode layer and an insulating layer. That is, a voltage is applied between the source electrode and the drain electrode having ohmic contact adjacent to the semiconductor layer, respectively, and the channel current passing between said electrodes is modulated by the bias voltage applied on the gate electrode provided through an insulating layer.

Figure 1:
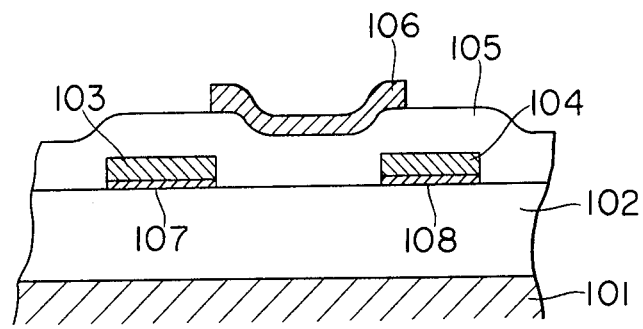
FIG. 1 shows a schematic sectional view for illustration of the structure of a semiconductor element of the present invention.

FIG. 1 shows an example of a typical basic structure of such TFT. On a semiconductor layer 102 comprising a polycrystalline silicon provided on an insulating substrate 101, a source electrode 103 and a drain electrode 104 are provided in contact with said semiconductor layer 102, and an insulating layer 105 is provided so as to cover over these electrodes, and there is a gate electrode 106 provided on said insulating layer 105.

In a TFT having the structure as shown in FIG. 1 in this invention, the semiconductor layer 102 is constituted of a poly-$Ge_xSi_{1-x}$:H thin film having the characteristics as described above, and between the semiconductor layer 102 and each of the two electrodes, namely the source electrode 103 and the drain electrode 104, there are formed a first n+ layer 107 and a second n+ layer 108, thus forming ohmic contact therebetween.

The insulating layer 105 may be constituted of a material such as silicon nitride, $SiO_2$, $Al_2O_3$ and the like which can be formed according to the CVD (Chemical Vapour Deposition) method, LPCVD (Low Pressure Chemical Vapour Deposition) method or PCVD (Plasma Chemical Vapour Deposition) method.

As the reactive gas to be employed for preparation of the poly-$Ge_xSi_{1-x}$:H thin film constituting the semiconductor layer, there may be included substances comprising silicon as constituent atoms, as exemplified by silane gases such as monosilane ($SiH_4$) and disilane ($Si_2H_6$), and substances comprising germanium as constituent atoms, as exemplified by germane gases such as monogermane ($GeH_4$), digermane ($Ge_2H_6$), trigermane ($Ge_3H_8$) and the like. These gases may also be diluted with gases such as $H_2$, Ar, He and the like.

The field effect type TFT can be classified into a type in which a gate insulating layer is provided on a gate electrode (lower gate type) and a type in which a gate electrode is provided on a gate insulating layer (upper gate type). It may also be classified into a type in which source and drain electrodes are provided on the semiconductor plane confronting the interface between the insulating layer and the semiconductor layer (Coplanar type) and source and drain electrodes are on the semiconductor plane confronting the interface between the insulating layer and the semiconductor layer (Stagger type). Thus, there are four types of combinations in all, as is well known in the art. The structure as shown in FIG. 1 is called as upper gate Coplanar type field effect TFT. In the present invention, any one of these types of field effect type TFT may be available as a matter of course.

In the present invention, various transistor characteristics can be improved by controlling the lower limit of hydrogen atom content in the polycrystalline semiconductor thin film to 0.01 atomic %. On the other hand, when the content of hydrogen atoms is within the range specified in the present invention, the hydrogen atoms contained in the semiconductor thin film exists at the crystal grain boundaries of poly-$Ge_xSi_{1-x}$:H, whereby good semiconductor characteristics can be obtained on account of the bondings existing in the form of Si—H and Ge—H. However, when the content of hydrogen atoms is in excess of 3 atomic %, bonding forms such as Si=$H_2$, Si≡$H_3$, Ge=$H_2$ and Ge≡$H_3$ or hydrogen in the free form may be expected to be contained, whereby deterioration of transistor characteristics which may be considered to be due to the hydrogen contained in such unstable conditions will frequently occur.

That is, from a number of experimental facts found by the present inventors, it has been observed that at a level of 3 atomic % or less of hydrogen atom contained in the poly-$Ge_xSi_{1-x}$:H semiconductor thin film, there is substantially no deterioration, whereby the characteristics can be maintained stably.

Also, in case when the content of hydrogen atom in said thin film is increased greater than 3 atomic %, for example, when the transistor is continuously actuated, it has been observed that $\mu$eff is decreased, and the output drain current is decreased with lapse of time with a change in threshold voltage $V_{TH}$. Accordingly, in the present invention, the hydrogen atom content contained in the semiconductor thin film of poly-$Ge_xSi_{1-x}$:H constituting the main portion of the semiconductor element may preferably be 0.01 to 3 atomic %, more preferably 0.05 to 2 atomic %, most preferably 0.1 to 1 atomic %.

Measurement of the hydrogen atom content in the polycrystalline semiconductor thin film defined in the present invention was conducted by means of a hydrogen analyzer conventionally used in chemical analysis (Model-240 type elemental analyzer, produced by Perkin Elmer Co.), when the content was 0.1 atomic % or more. Each sample was charged in an amount of 5 mg in a holder for analyzer, the weight of hydrogen was measured and the hydrogen content in the film was calculated in atomic %.

Analysis of a hydrogen content less than 0.1 atomic % was conducted by means of a secondary ion mass spectrometer-SIMS-(Model IMS-3f, produced by Cameca Co.). A conventional method was followed in this analytical method. That is, for prevention of charge-up, gold was vapor deposited to a thickness of 200 Å on a thin film of the sample, and measurement was conducted under the conditions of an ion energy of primary ion beam of 8 KeV and a sample current of $5 \times 10^{-10}$ A, with a spot size of 50 $\mu$m in diameter and an etching area of 250 $\mu$m $\times$ 250 $\mu$m, to determine the detection intensity ratio of $H^+$ ion relative to $Si^+$ and $Ge^+$, from which the hydrogen content was calculated in terms of atomic %.

The change with lapse of time of the polycrystalline silicon thin film transistor (TFT) for showing the effect of the present invention was performed according to the method as described below.

Figure 2:
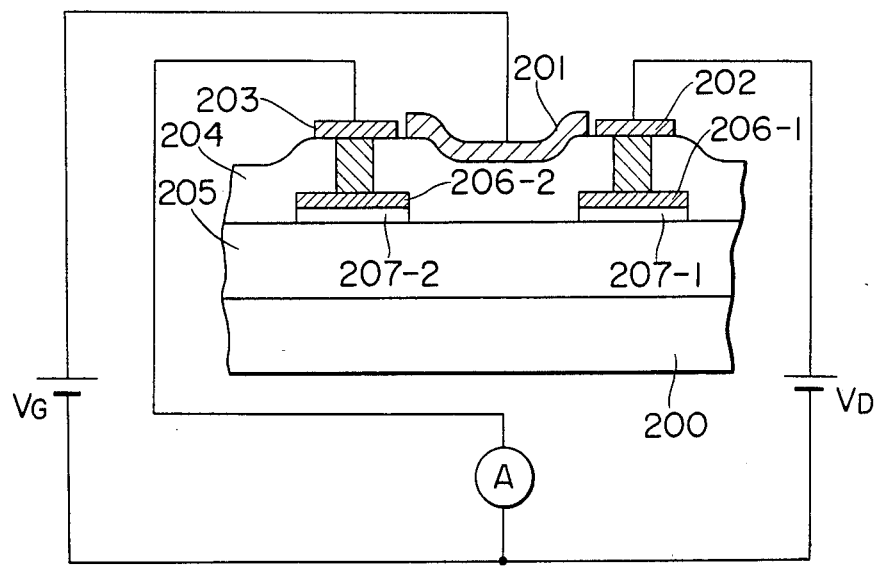
FIG. 2 shows a schematic view for illustration of the circuit for measurement of the characteristics of the semiconductor element of the present invention.
Figure 4A:
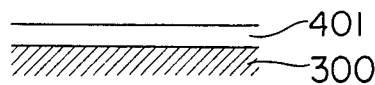
FIG. 4 shows a schematic chart for illustration of the steps for preparation of the semiconductor element of the present invention.
Figure 4B:
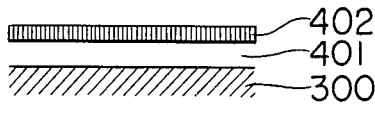
Figure 4C:
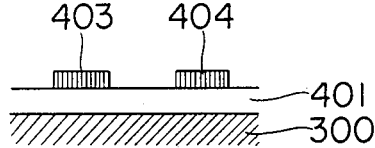
Figure 4D:
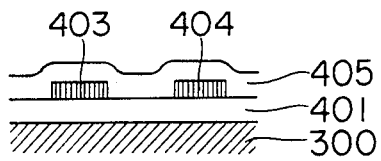
Figure 4E:
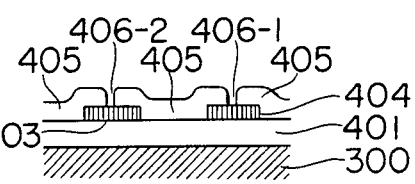
Figure 4F:
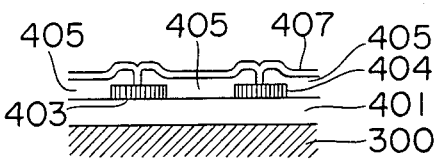
Figure 4G:
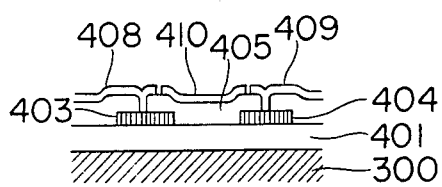

First, a TFT having a structure as shown in FIG. 2 was prepared, and by applying a gate voltage $V_G=40$ V on the gate 201 and a drain voltage $V_D=40$ V between between the source 203 and the drain 202, the drain current $I_D$ passed between the source 203 and the drain 202 was measured by an electrometer (Keithley 610 C electrometer). The percentage of the change with lapse of time was determined by dividing the change of drain current after 500 hours continuous actuation by the initial drain current and multiplying the value obtained by 100 so as to be represented in %.

The threshold voltage $V_{TH}$ of TFT was defined, as conventionally conducted in MOS FET (Metal oxide semiconductor field effect transistor), as the point at which the line extrapolated from the straight line portion in $V_D - \sqrt{I_D}$ curve crosses over the abscissa of $V_D$. The changes of $V_{TH}$ before and after the change with lapse of time were examined at the same time and the changed quantity ($\Delta V_{TH}$) was represented in volts.

The hydrogen atom content in the polycrystalline silicon thin film semiconductor layer can be controlled to such a quantity as mentioned above according to various methods. For example, it can be realized under the specific conditions according to the method in which a gaseous hydrogenated silicon such as $SiH_4$, $Si_2H_6$ and the like, and a gaseous hydrogenated germanium such as $GeH_4$, $Ge_2H_6$ and the like is precipitated by the glow discharge decomposition (GD method), the method in which sputtering is effected using a Ge target in a gas containing $H_2$ or $GeH_4$ (SP method), the method in which Ge is subjected to vapor deposition by use of electron beam in a $H_2$ gas plasma atmosphere (IP method), the method in which vapor deposition is effected under a $H_2$ atmosphere with ultra-high degree of vacuum, as well as the method in which a poly-$Ge_xSi_{1-x}$:H thin film formed by CVD or LPCVD is subjected to the $H_2$ gas plasma treatment, and so on.

As disclosed in the present invention, formation of a polycrystalline semiconductor thin film suited for the object of the present invention may be possible according to the GD method, the SP method, the IP method and the HVD method at a substrate surface temperature of 500° C. or lower (in the range of about 350° to 500° C.). This fact is not only advantageous in uniform heating of the substrate or provision of a cheap substrate material of large area in preparation of a driving circuit or a scanning circuit covering a large area for a large area device, but also important in that it can respond to the requirement to use a light-transmissive glass plate as a substrate for transmissive-type display device or in applications of an image device such as in case of a photoelectric converting light-receiving element of the type in which light enters on the substrate side.

Accordingly, since the present invention can be practiced at lower temperature zones as compared with the prior art techniques, commercial low melting glasses, heat-resistant plastics, etc. may also be available in addition to heat-resistant glasses such as high melting glasses, hard glass, etc., heat-resistant ceramics, sapphire, spinel, silicon wafer, etc. conventionally used in the prior art. As the commercial glass substrate with the use of a low melting glass, it may be considered to use a regular glass having a softening point of about 630° C., an ordinary hard glass having a softening point of about 780° C., a ultra-hard glass having a softening point of about 820° C. (JIS First grade ultra-hard glass), etc.

In the preparation method of this invention, an advantage is involved in that films can be prepared without impairing the substrate, because any substrate can be used with a substrate temperature which can be suppressed lower than the softening point of the substrate employed.

In Examples of the present invention, there was primarily employed as the substrate glass Corning #7059 glass among the regular glasses (soda glasses) having relatively low softening points, but it is of course possible to use a quartz glass having a softening point of 1,500° C. as the substrate. However, from a practical standpoint, the use of regular glasses is advantageous in preparation of a thin film transistor (TFT) at low cost and over a large area.

In the present invention, as the value of x in poly-$Ge_xSi_{1-x}$:H in constituting the polycrystalline semiconductor layer which constitutes the main part of the semiconductor device, it may be represented by the formula: $0 < x \leq 1$ as mentioned above, but it is perferably $0.01 \leq x \leq 1$, more preferably $0.05 \leq x \leq 1$, most preferably $0.1 \leq x \leq 1$.

In order to further illustrate the present invention, preparation of poly-$Ge_xSi_{1-x}$:H semiconductor thin films, preparation process of TFT and the results of TFT behaviors are described in detail below by way of Examples.

EXAMPLE 1

Figure 3:
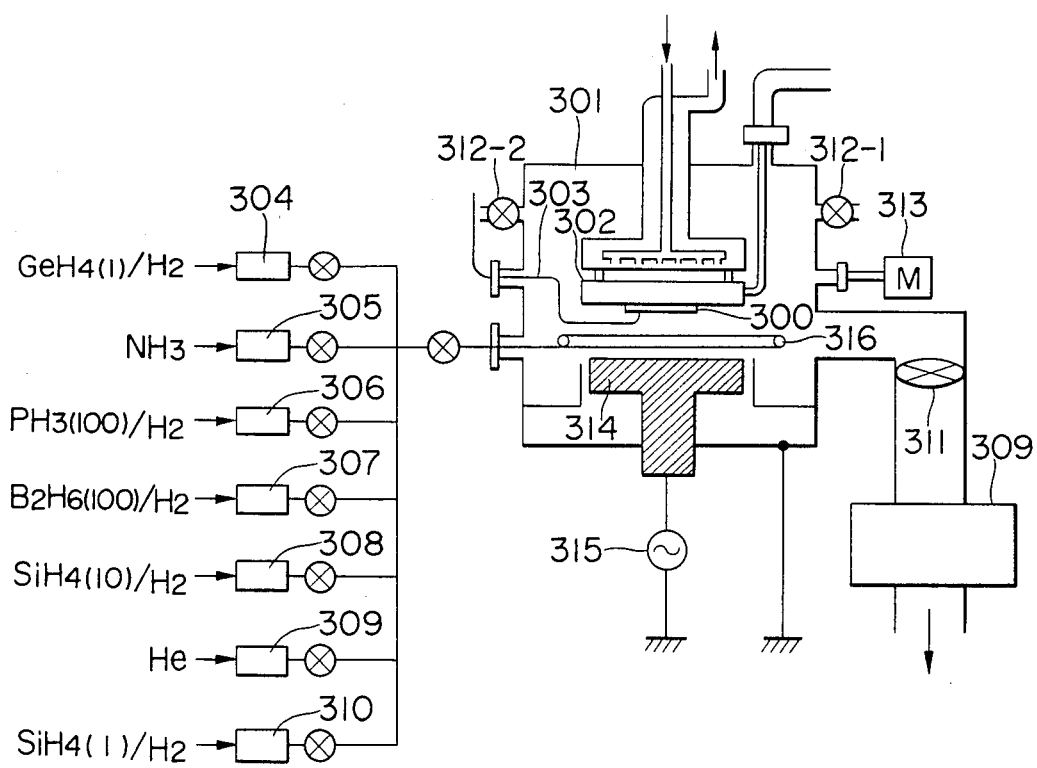

This example describes the preparation of a TFT by formation of a polycrystalline germanium thin film on a substrate by means of the device as shown in FIG. 3. As the substrate 300, Corning #7059 glass was used.

First, after the substrate 300 was washed, it was lightly etched on its surface with a mixture of $HF/HNO_3/CH_3COOH$ and after drying it was mounted on a substrate heating holder 302 placed on the anode side in a vacuum deposition chamber hereinafter 301. Then, the bell-jar 301 was evacuated by a diffusion pump 309 to a background vacuum degree of $2 \times 10^{-6}$ Torr. During this operation, if the pressure is high, not only the reactive gas cannot contribute effectively to film precipitation, but also entrainment of oxygen or nitrogen may also occur in the film to cause undesirably marked changes in the resistance of the film. Next, the substrate temperature Ts was raised and the substrate 300 was maintained at 400° C. The substrate temperature was monitored by a thermocouple 303.

In this Example, as the reactive gases to be introduced, $GeH_4$ gas diluted to 1 vol. % with $H_2$ gas [hereinafter written as $GeH_4(1)/H_2$] and $B_2H_6$ gas diluted to 10 vol.ppm [hereinafter written as $B_2H_6(100)/H_2$] were employed. The gas flow rate of $GeH_4(1)/H_2$ was controlled to 60 SCCM through a mass flow controller 304, and further that of $B_2H_6(100)/H_2$ to 30 SCCM through a mass flow controller 307, and both gases were introduced together through the ring-shaped gas blowing outlet 316 into the bell-jar 301, and the bell-jar was set at a pressure of 0.01 Torr by controlling the main valve 310 by means of an absolute pressure gauge 312. After the pressure in the bell-jar was stabilized, a high frequency electric field of 13.56 MHz was applied on the cathode electrode 313 by the power source 315 to commence glow discharging. The voltage was 0.6 KV, with the current being 55 mA and RF (Radio Frequency) discharging power 20 W. The film formed had a thickness of $0.5\mu$ and its uniformity was within $\pm 10\%$ relative to the substrate dimensions of 120 (mm) × 120 (mm) when employing a circular ring blowing outlet. The hydrogen content in the film formed was found to be 0.3 atomic %.

As the next step, following the process as shown in FIG. 4, a TFT was prepared using this film as the base material. As shown in the step (a), after precipitation of a polycrystalline germanium film 401 formed on the substrate 300 as described above, $PH_3$ gas diluted to 100 vol.ppm with hydrogen gas [hereinafter written as $PH_3(100)/H_2$] was permitted to flow into the bell-jar 301 at a ratio of $5 \times 10^{-3}$ of $PH_3$ gas relative to $GeH_4$ gas to adjust the pressure in the bell-jar 301 to 0.12 Torr, whereupon glow discharging was effected to form a n+ layer 402 doped with phosphorus to a thickness of 0.05μ [step (b)].

Subsequently, as the step (c), the n+ layer 402 was removed by photoetching except for the regions of the source electrode 403, and the drain electrode 404. Then, the above substrate was mounted again onto the heating holder 302 on the anode side in the bell-jar 301 so as to form a gate insulating film thereon. Similarly as in preparation of the polycrystalline germanium, the bell-jar 301 was evacuated, the substrate temperature maintained at 250° C. and glow discharging was excited by introduction of NH3 gas of a purity of 100% through a mass flow controller 305 controlled at 20 SCCM and SiH4 diluted to 10 vol. % with H2 [hereinafter written as SiH4(10)/H2] through a mass flow controller 308 controlled at 5 SCCM, whereby SiNH film 405 was deposited to a thickness of 0.25μ [step (d)].

Next, contact holes 406-1 and 406-2 for the source electrode 403 and the drain electrode 404 were opened by the photoetching step [step (e)], and thereafter an electrode film 407 was formed on the entire surface of the SiNH film 405 by vapor deposition of Al [step (f)], followed by working of the Al electrode film 407 by the photoetching step to form the lead-out electrode 408 for the source electrode, the lead-out electrode 409 for the drain electrode and the gate electrode 410 [step (g)]. Thereafter, heat treatment was conducted at 250° C. in H2 atmosphere.

The thin film transistor (channel length L=20μ, channel width W=650μ) formed according to the process under the conditions as described above was found to exhibit stable and good characteristics.

Figure 7:
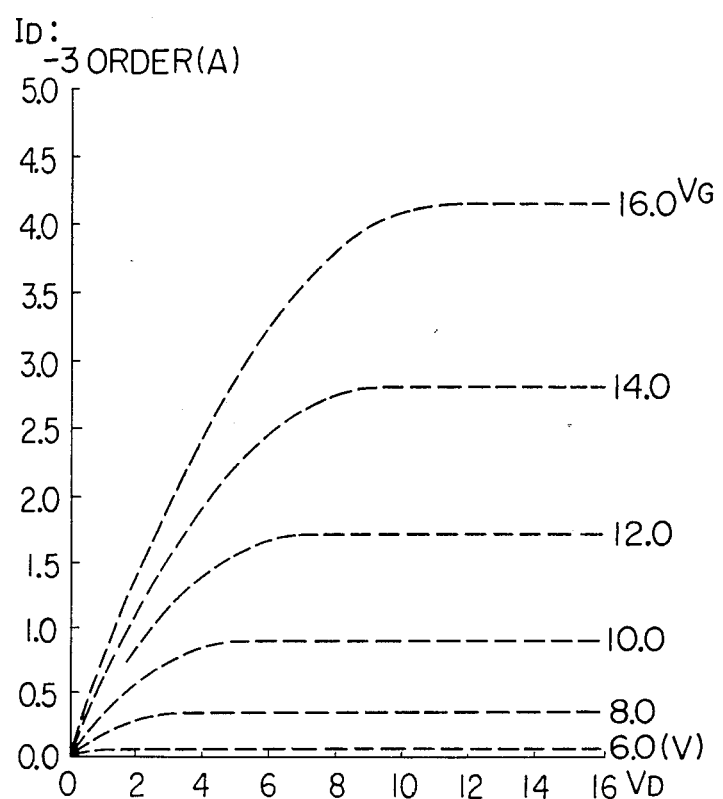
FIG. 7 and FIG. 9 each shows a graph for illustration of one example of $V_D - I_D$ characteristic of the semiconductor element of the present invention.

FIG. 7 shows exemplary $V_D - I_D$ characteristic curve of the thus prepared TFT. As can be seen from FIG. 7, at $V_G = 10$ V, $I_D = 8 \times 10^{-4}$ A, while at $V_G = 0$ V, $I_D = 3 \times 10^{-7}$ A, and the threshold voltage was 4.8 V. The μeff as obtained from the straight line portion of $V_G - \sqrt{I_D}$ curve as generally practiced in MOS-TFT devices was found to be 120 cm²/V.sec. Thus, a TFT of great mobility having good transistor characteristics capable of forming various driving circuits was obtained.

For examination of stability of this TFT, DC voltage was continued to be applied on the gate at a direct current voltage of $V_G = 40$ V, and measurement of change of $I_D$ was continuously conducted over 500 hours. As the result, there was substantially no change, all the changes being within ±0.1%. And, there was also no change in threshold voltage $\Delta V_{TH}$ before and after the change with lapse of time of TFT, thus indicating extremely good stability of the TFT. $V_D - I_D$, $V_G - I_D$ characteristics were also measured after the change with lapse of time to find that they were not changed as before measurement of the change with lapse of time, with μeff value being also the same as 120 cm²/V.sec.

As shown in this Example, a TFT of which a main part is constituted of a polycrystalline germanium thin film containing a hydrogen atom content of 0.3 atomic % was found to be a transistor having very high performance.

EXAMPLE 2

According to the same procedure as in Example 1, a polycrystalline germanium film was prepared on a Vycor glass substrate under the conditions of RF power of 50 W, GeH4(1)/H2 flow rate of 60 SCCM, B2H6(100)/H2 flow rate of 30 SCCM and a pressure of 0.05 Torr. The substrate temperature (Ts) was set over 200° C. to 700° C. at intervals of 50° C. until the film was prepared to have a thickness of 0.5μ. And, the hydrogen atom contents of respective polycrystalline germanium semiconductor layers were measured, and TFT's (Sample No. 1-1 to 1-11) prepared according to the same method as in Example 1 from respective films were found to have μeff as shown in Table 1.

As apparently seen from Table 1, the samples with hydrogen atom contents in excess of 3 atomic % or less than 0.01 atomic % have a μeff of less than 100 cm²/V.sec, the change of $I_D$ with lapse of time and $\Delta V_{TH}$ are relatively large, and the characteristics are also inferior in stability.

TABLE 1

| Sample No. | 1-1 | 1-2 | 1-3 | 1-4 | 1-5 | 1-6 | 1-7 | 1-8 | 1-9 | 1-10 | 1-11 |
|---|---|---|---|---|---|---|---|---|---|---|---|
| $T_s$ (°C.) | 200 | 250 | 300 | 350 | 400 | 450 | 500 | 550 | 600 | 650 | 700 |
| Hydrogen atom content (atomic %) | 5.2 | 4.3 | 3.6 | 2.8 | 1.2 | 0.9 | 0.5 | 0.2 | 0.08 | 0.02 | <0.01 |
| μeff (cm²/V.sec) | 25 | 42 | 53 | 82 | 110 | 125 | 135 | 130 | 120 | 105 | 55 |
| Change in $I_D$ with lapse of time (%) | 2.5 | 1.2 | 1.8 | ≦0.1 | ≦0.1 | ≦0.1 | ≦0.1 | ≦0.1 | ≦0.1 | ≦0.1 | 1.2 |
| $\Delta V_{TH}$ (V) | 0.5 | 0.3 | 0.2 | 0 | 0 | 0 | 0 | 0 | 0 | 0 | 0 |

EXAMPLE 3

Figure 5:
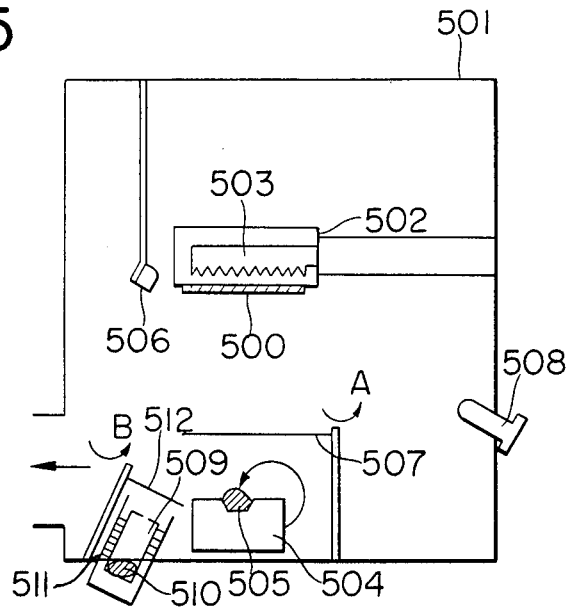
FIG. 3, FIG. 5, FIG. 6 and FIG. 8 each shows a schematic sectional view for illustration of an example of a device for preparation of a polycrystalline semiconductor thin film.

Next, Example 3 is described in detail by referring to FIG. 5.

First a Corning #7059 glass substrate 500 prepared similarly as in Example 1 was mounted on a substrate holder 502 in a vacuum chamber 501 which can be reduced to a pressure of $2 \times 10^{-11}$ Torr, and after the pressure in the vacuum chamber 501 was reduced to $5 \times 10^{-11}$ or lower, the substrate temperature was set by a heater 503 at 400° C. Subsequently, an electron gun 504 was actuated by an accelerating voltage of 10 KV, and the electron beam emitted was irradiated on a germanium vaporizable body 505 to effect vaporization of the germanium body 505. Further, the Knudsen cell 509 was heated by the heater 511 to have boron 510 vaporized from the Knudsen cell 509, followed by opening of the shutter 512 and the shutter 507 to form a polycrystalline germanium film, while controlling by means of a quartz oscillator film thickness gauge so that a film thickness of 0.5μ may be formed on the substrate 500. The pressure during this vapor deposition was $1.2 \times 10^{-9}$ Torr and vapor deposition rate was 1.0

Å/sec. The thus prepared sample is identified as Sample 3-1.

Next, a Corning #7059 glass substrate 500 prepared similarly was fixed on the substrate holder 502, and after evacuation of the vacuum chamber 501 to a pressure of $5 \times 10^{-11}$ Torr or less, a high purity hydrogen gas (99.999%) was introduced through a variable leak valve 508 into the vacuum chamber 501 to make the inner chamber pressure to $5 \times 10^{-7}$, followed by setting of the substrate temperature to 400° C. Similarly as in preparation of Sample 3-1, germanium and boron were vaporized to form a film. The film forming rate was controlled to 1.0 Å/sec to form a polycrystalline germanium film. The thus prepared sample is identified as Sample 3-2.

For Samples 3-1 and 3-2, hydrogen contents contained in respective polycrystalline germanium thin films were measured, and each TFT prepared by use of each sample in the same manner as in Example 1 was subjected to measurement of $\mu$eff, change in $I_D$ with lapse of time, the changed value $\Delta V_{TH}$ of threshold voltage. The results are shown in Table 2.

As apparently seen from Table 2, the hydrogen atom content in the polycrystalline germanium thin film was less than 0.01 atomic % for Sample 3-1, while it was 0.5 atomic % in Sample 3-2.

As the result, the effective carrier mobility $\mu$eff of TFT prepared was greater in case of Sample 3-2, as compared with that of Sample 3-1, and also Sample 3-2 was better in stability TFT, thus being preferable as a semiconductor layer for TFT.

TABLE 2

| Sample No. | 3-1 | 3-2 |
| --- | --- | --- |
| Hydrogen atom content (atomic %) | ≦0.01 | 0.5 |
| $\mu$eff (cm$^2$/V.sec) | 32 | 60 |
| Change in $I_D$ with lapse of time (%) | 2.0 | ≦0.1 |
| $\Delta V_{TH}$ (V) | 0.4 | 0 |

EXAMPLE 4

Next, an example having formed a polycrystalline germanium thin film according to the sputtering method is to be described in detail by referring to FIG. 3.

A Corning #7059 glass substrate 300 prepared similarly as in Example 1 was fixed in close contact with a substrate heating holder 302 on the upper anode side in a bell-jar 301, and a polycrystalline germanium plate (not shown, purity: 99.999%) was placed on the lower cathode electrode 314 so as to confront the substrate. The inner pressure in the bell-jar was evacuated by means of a diffusion pump 309 to $1 \times 10^{-6}$ Torr or less, whereupon the substrate heating holder 302 was heated to maintain the surface temperature of the substrate 300° at 400° C.

B$_2$H$_6$(100)/H$_2$ gas was introduced through a mass flow controller 307 at a flow rate of 5 SCCM, and further H$_2$ gas through a mass flow controller 309 at a flow rate of 50 SCCM, into the bell-jar 301, and the inner pressure in the bell-jar was set at 0.02 Torr by narrowing the main valve 310.

After the inner bell-jar pressure was stabilized, a high frequency electric field of 13.56 MHz was applied by a power source 314 to a voltage of 2.5 KV on the lower cathode electrode 313 to excite glow discharging between the polycrystalline germanium plate on the cathode electrode 313 and the anode (substrate heating holder) 302 to have p-type polycrystalline germanium deposited on the glass substrate 300. The film formed had a thickness of 0.48$\mu$. The hydrogen atom content in the polycrystalline germanium thin film formed was 1.2 atomic %.

By use of the sample obtained, TFT was prepared according to the same method as in Example 1, and it was found to be a good TFT exhibiting stable and good transistor characteristics, with $\mu$eff of 65 cm$^2$/V.sec, change in $I_D$ with lapse of time less than 0.1% and the changed value $\Delta V_{TH}$ of threshold voltage of 0 V.

EXAMPLE 5

Figure 6:
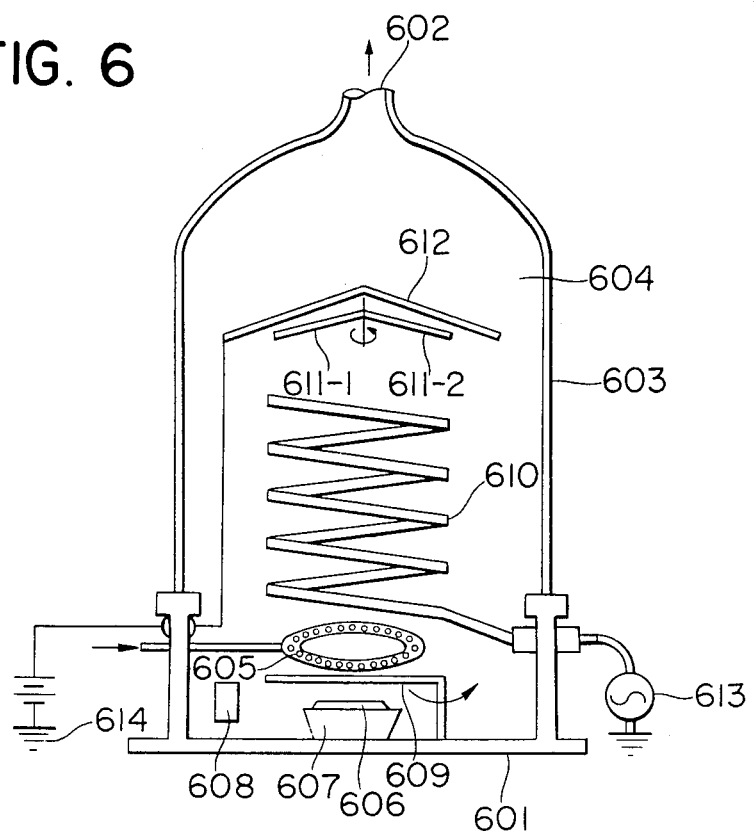

The present invention is now described with respect to a TFT prepared by use of a polycrystalline germanium thin film which was prepared by means of an ion plating deposition device as shown in FIG. 6.

First, a germanium vaporizing body 606 of a polycrystalline germanium was placed in a boat 607 in a deposition chamber 603 which can be brought to a reduced pressure, a Corning #7059 glass substrate was placed on supports 611-1 and 611-2 and the pressure in the deposition chamber 603 was evacuated to about $1 \times 10^{-7}$ Torr. Then, through a gas introducing tube 605, H$_2$ gas with a purity of 99.999% was introduced into the deposition chamber 603 so that the partial hydrogen pressure P$_H$ may become $1 \times 10^{-4}$ Torr. The gas introducing tube 605 employed had an inner diameter of 2 mm and had a loop-shaped portion at the tip, at which gas blowing apertures of 0.5 mm in diameter were opened at intervals of 2 cm.

Then, high frequency of 13.56 MHz was applied to an output of 150 W on a high frequency coil 610 (diameter: 5 mm) to create a high frequency plasma atmosphere internally within the high frequency coil 610.

On the other hand, while setting the supports 611-1 and 611-2 on rotation, the heating device 612 was placed under actuated state to have the glass substrate heated to about 400° C.

As the next step, by irradiation of the germanium vaporizing body 606 from an electron gun, heated germanium particles were created. Thus, a polycrystalline germanium film was formed to a thickness of about 0.5$\mu$, and by use of this film TFT was prepared following the same steps as in Example 1 (Sample 5-1). Also, from a film formed without introduction of hydrogen during formation of the polycrystalline germanium thin film, TFT was prepared similarly as in preparation of Sample 5-1 (Sample 5-2). For each of the thus prepared samples, $\mu$eff, change in $I_D$ with lapse of time, changed value $\Delta V_{TH}$ of threshold voltage were measured to obtain the results shown in Table 3.

TABLE 3

| Sample No. | 5-1 | 5-2 |
| --- | --- | --- |
| Partial hydrogen pressure. P$_H$ (Torr) | $1 \times 10^{-4}$ | 0 |
| Hydrogen atom content (atomic %) | 1.5 | 0 |
| $\mu$eff (cm$^2$/V.sec) | 55 | 20 |
| Change in $I_D$ with lapse of time (%) | ≦0.1 | 1.5 |
| $\Delta V_{TH}$ (V) | 0 | 0.5 |

As can be seen from Table 3, Sample 5-1 is entirely without change in $I_D$ with lapse of time, and also has a large $\mu$eff of 55, thus exhibiting good transistor characteristics.

EXAMPLE 6

This example describes preparation of a TFT by formation of a polycrystalline silicon germanium thin film on a substrate by means of the device as shown in FIG. 3. As the substrate 300, Corning #7059 glass was used.

First, after the substrate 300 was washed, it was lightly etched on its surface with a mixture of $HF/HNO_3/CH_3COOH$ and after drying mounted on a substrate heating holder 302 placed on the anode side in a bell-jar 301. Then, the bell-jar 301 was evacuated by a diffusion pump 309 to a background vacuum degree of $1 \times 10^{-6}$ Torr. It is undesirable during this operation to have a high pressure, because not only the reactive gas cannot contribute effectively to film precipitation, but also entrainment of oxygen, nitrogen may occur in the film to cause undesirably marked changes in the resistance of the film. Next, the substrate temperature $T_s$ was raised and the substrate 300 was maintained at 500° C. The substrate temperature was monitored by a thermocouple 303.

In this Example, as the reactive gases to be introduced, $SiH_4$ gas diluted to 1 vol. % with $H_2$ gas [hereinafter written as $SiH_4(1)/H_2$], $GeH_4(1)/H_2$ and $B_2H_6(100)/H_2$ were employed. The gas flow rate of $SiH_4(1)/H_2$ was controlled to 40 SCCM through a mass flow controller 310, that of $GeH_4(1)/H_2$ was controlled to 20 SCCM through a mass flow controller 304 and further that of $B_2H_6(100)/H_2$ to 30 SCCM through a mass flow controller 307, and these gases were introduced together through the ring-shaped gas blowing outlet 315 into the bell-jar 301, and the bell-jar was set at a pressure of 0.01 Torr by controlling the main valve 317 by means of an absolute pressure gauge 313.

After the pressure in the bell-jar was stabilized, a high frequency electric field of 13.56 MHz was applied on the cathode electrode 314 to commence glow discharging. The voltage was 0.6 KV, with the current being 55 mA and RF (Radio Frequency) discharging power 20 W. The film formed had a thickness of 0.5μ and its uniformity was within ±10% relative to the substrate dimensions of 120×120 mm when employing a circular ring blowing outlet. The hydrogen content in the film formed was found to be 0.2 atomic %.

As the next step, following the process as shown in FIG. 4, a TFT was prepared using this film as the base material. As shown in the step (a), after precipitation of a polycrystalline silicon.germanium film 401 formed on the substrate 300 as described above, $PH_3(100)/H_2$ was permitted to flow into the bell-jar 301 at a mol ratio of $5 \times 10^{-3}$ of $PH_3$ gas relative to the total amount of $GeH_4$ gas and $SiH_4$ gas to adjust the pressure in the bell-jar 301 to 0.12 Torr, whereupon glow discharging was effected to form an n+ layer 402 doped with phosphorus to a thickness of 0.05μ [step (b)].

Subsequently, as the step (c), the n+ layer 402 was removed by photoetching except for the regions of the source electrode 403, and the drain electrode 404. Then, the above substrate was mounted again onto the heating holder 302 on the anode side in the bell-jar 301 so as to form a gate insulating film thereon. Similarly as in preparation of the polycrystalline germanium, the bell-jar 301 was evacuated, the substrate temperature maintained at 250° C. and glow discharging was excited by introduction of $NH_3$ gas of a purity of 100% through a mass flow controller 305 controlled at 20 SCCM and $SiH_4$ diluted to 10 vol. % with $H_2$ [hereinafter written as $SiH_4(10)/H_2$] through a mass flow controller 308 controlled at 5 SCCM, whereby SiNH film 405 was deposited to a thickness of 0.25μ [step (d)].

Next, contact holes 406-1 and 406-2 for the source electrode 403 and the drain electrode 404 were opened by the photoetching step [step (e)], and thereafter an electrode film 407 was formed on the entire surface of the SiNH film 405 by vapor deposition of Al [step (f)], followed by working of the Al electrode film 407 by the photoetching step to form the lead-out electrode 408 for the source electrode, the lead-out electrode 409 for the drain electrode and the gate electrode 410 [step (g)]. Thereafter, heat treatment was conducted at 250° C. in H atmosphere.

The TFT (channel length L=20μ, channel width W=650μ) formed according to the process under the conditions as described above was found to exhibit stable and good characteristics.

Figure 9:
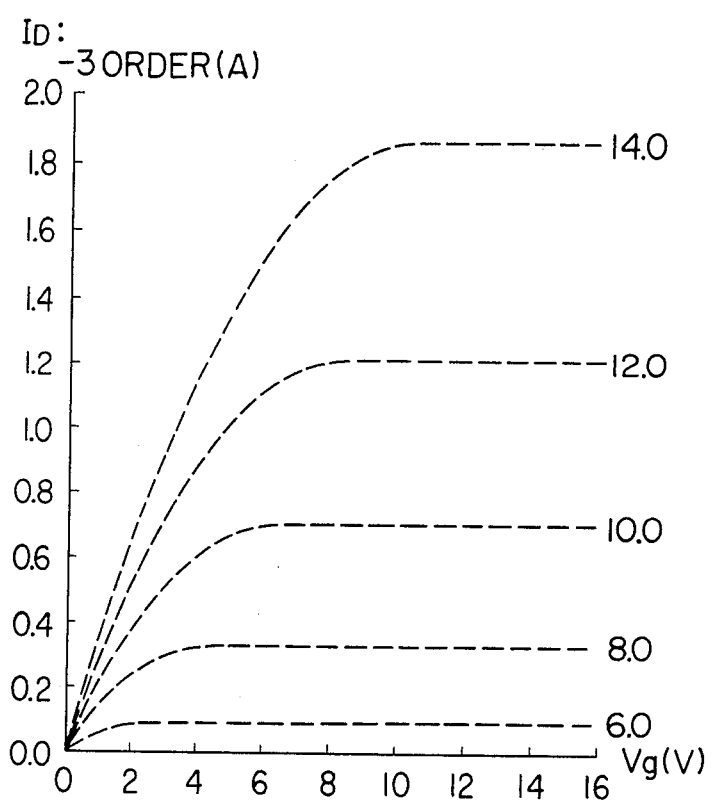

FIG. 9 shows exemplary $V_D - I_D$ characteristic curve of the thus prepared TFT. As can be seen from FIG. 9, at $V_G = 10$ V, $I_D = 6.8 \times 10^{-4}$ A, while at $V_G = 0$ V, $I_D = 4 \times 10^{-8}$ A, and the threshold voltage was 3.7 V. The $\mu$eff as obtained from the straight line portion of $V_G - \sqrt{I_D}$ curve as generally practiced in MOS-TFT devices was found to be 55 cm$^2$/V.sec. Thus, a TFT of great mobility having good transistor characteristics capable of forming various driving circuits was obtained.

For examination of stability of this TFT, DC voltage was continued to be applied on the gate at a direct current voltage of $V_G = 40$ V, and measurement of change in $I_D$ was continuously conducted over 1000 hours. As the result, there was no change in $I_D$. And, there was also no change in threshold voltage $\Delta V_{TH}$ before and after the change with lapse of time, thus indicating extremely good stability of the TFT. $V_D - I_D$, $V_G - I_D$ characteristics were also measured after the change with lapse of time to find that they were not changed as before measurement of the change with lapse of time, with $\mu$eff value being also the same as 55 cm$^2$/V.sec.

As shown in this Example, a TFT of which main part is constituted of a polycrystalline silicon germanium thin film with a hydrogen atom content of 0.2 atomic % was found to be a transistor having very high performance.

EXAMPLE 7

According to the same procedure as in Example 6, a polycrystalline silicon germanium film was prepared on a Vycor glass substrate under the conditions of RF power of 40 W, $SiH_4(1)/H_2$ flow rate of 40 SCCM, $GeH_4(1)/H_2$ flow rate of 20 SCCM, $B_2H_6(100)/H_2$ flow rate of 30 SCCM and a pressure of 0.02 Torr. The substrate temperature ($T_s$) was set over 200° C. to 700° C. at intervals of 50° C. until the film was prepared to have a thickness of 0.5μ. And, the hydrogen atom contents of respective polycrystalline silicon germanium semiconductor layers were measured, and TFT's (Sample No. A1-1 to A1-11) prepared according to the same method as in Example 6 from respective films were found to have $\mu$eff as shown in Table 1-A.

As apparently seen from Table 1-A, the samples with hydrogen atom contents in excess of 3 atomic % or less than 0.01 atomic % have a $\mu$eff of less than 100 cm$^2$/V.sec, the change in $I_D$ with lapse of time and $\Delta V_{TH}$ are relatively large, and the characteristics are also inferior in stability.

TABLE 1-A

| Sample No. | Al-1 | Al-2 | Al-3 | Al-4 | Al-5 | Al-6 | Al-7 | Al-8 | Al-9 | Al-10 | Al-11 |
| --- | --- | --- | --- | --- | --- | --- | --- | --- | --- | --- | --- |
| $T_s$ (°C.) | 200 | 250 | 300 | 350 | 400 | 450 | 500 | 550 | 600 | 650 | 700 |
| Hydrogen atom content (atomic %) | 6.5 | 5.5 | 4.2 | 3.2 | 2.7 | 1.5 | 0.2 | 0.1 | 0.06 | 0.01 | <0.01 |
| $\mu$eff (cm$^2$/V.S) | 4 | 7 | 15 | 21 | 42 | 53 | 55 | 58 | 52 | 18 | 12 |
| Change in $I_D$ with lapse of time (%) | 1.5 | 1.2 | 0.8 | 0.3 | ≦0.1 | ≦0.1 | ≦0.1 | ≦0.1 | ≦0.1 | ≦0.1 | 0.8 |
| $\Delta V_{TH}$ (V) | 0.6 | 0.6 | 0.4 | 0.2 | 0 | 0 | 0 | 0 | 0 | 0 | 0.1 |

EXAMPLE 8

Next, Example 8 is described in detail by referring to FIG. 5.

First, a Corning #7059 glass substrate prepared similarly as in Example 6 was mounted on a substrate holder 502 in a vacuum chamber 501 which can be reduced to a pressure of $2 \times 10^{-11}$ Torr, and after the pressure in the vacuum chamber 501 was reduced to $4 \times 10^{-11}$ Torr or lower, the substrate temperature was set by a heater 503 at 500° C. Subsequently, an electron gun 504 was actuated by an accelerating voltage of 10 KV, and the electron beam emitted was irradiated on a silicon vaporizable body 505. Further, the electron gun 504 was actuated by an accelerating voltage of 10 KV, and the electron beam emitted was irradiated on a germanium vaporizable body. Subsequently, the Knudsen cell 509 was heated by the heater 511 to have boron 510 vaporized from the Knudsen cell 509, followed by opening of the shutters 507 to form a polycrystalline silicon germanium film, while controlling by means of a quartz oscillator film thickness gauge 506 so that a film thickness of 0.5$\mu$ may be formed on the substrate 500. The pressure during this vapor deposition was $1.5 \times 10^{-9}$ Torr and vapor deposition rate was 1.4 Å/sec. The thus prepared sample is salled as Sample A3-1.

Next, a Corning #7059 glass substrate 500 prepared similarly was fixed on the substrate holder 502, and after evacuation of the vacuum chamber 501 to a pressure of $4 \times 10^{-11}$ Torr or less, a high purity hydrogen gas (99.999%) was introduced through a variable leak valve 508 into the vacuum chamber 501 to make the inner chamber pressure to $2 \times 10^{-7}$, followed by setting of the substrate temperature to 500° C. Similarly as in preparation of Sample A3-1, silicon. germanium and boron were vaporized to form a film. The film forming rate was controlled to 1.4 Å/sec to form a polycrystalline silicon germanium film having 0.5$\mu$ in thickness. The thus prepared sample is called as Sample A3-2.

For Samples A3-1 and A3-2, hydrogen contents containing in respective polycrystalline silicon germanium thin films were measured, and each TFT prepared by use of each sample in the same manner as in Example 6 was subjected to measurement of $\mu$eff, change in $I_D$ with lapse of time, the changed value $\Delta V_{TH}$ of threshold voltage. The results are shown in Table 2-A.

As apparently seen from Table 2-A, the hydrogen atom content in the polycrystalline silicon germanium thin film was so small as less than 0.01 atomic % for Sample A3-1, while it was 0.3 atomic % in Sample A3-2.

As the result, the effective carrier mobility $\mu$eff of TFT prepared was greater in case of Sample A3-2, as compared with that of Sample A3-1, and also Sample A3-2 was better in stability TFT, thus being preferable as a semiconductor layer for TFT.

TABLE 2-A

| Sample No. | A3-1 | A3-2 |
| --- | --- | --- |
| Hydrogen atom content (atomic %) | <0.01 | 0.3 |
| $\mu$eff (cm$^2$/V.S) | 28 | 42 |
| Change in $I_D$ with lapse of time (%) | 1.5 | ≦0.1 |
| $\Delta V_{TH}$ | 0.2 | 0 |

EXAMPLE 9

The present invention is now illustrated with respect to a TFT prepared by use of a polycrystalline silicon germanium thin film which was prepared by means of an ion plating deposition device as shown in FIG. 6.

First, a silicon vaporizable body 606 for a polycrystalline silicon.germanium was placed in a boat 607, and another germanium vaporizable body 606 placed in a boat (not shown) in a deposition chamber 603 which can be brought to a reduced pressure, a Corning #7059 glass substrate was placed on supports 611-1 and 611-2 and the pressure in the deposition chamber 603 was evacuated to about $1 \times 10^{-7}$ Torr. Then, through a gas introducing tube 605, H$_2$ gas with a purity of 99.999% was introduced into the deposition chamber 603 so that the partial hydrogen pressure P$_H$ may become $1 \times 10^{-4}$ Torr. The gas introducing tube 605 employed had an inner diameter of 2 mm and had a loop-shaped portion at the tip, at which gas blowing apertures of 0.5 mm in diameter were opened at intervals of 2 cm.

Then, an output of 200 W having high frequency of 13.56 MHz was applied to a high frequency coil 610 (diameter: 5 mm) to create a high frequency plasma atmosphere internally within the high frequency coil 610.

On the other hand, while setting the supports 611-1 and 611-2 on rotation, the heating device 612 was placed under actuated state to have the glass substrate heated to about 450° C.

As the next step, by irradiation of the silicon vaporizable body 606 and the germanium vaporizable body 606 from respective electron guns, silicon and germanium were respectively heated, whereby silicon particles and germanium particles were created. Thus, a polycrystalline silicone germanium film was formed to a thickness of about 0.5$\mu$, and by use of this film TFT was prepared following the same steps as in Example 6 (Sample A4-1). Also, from a film formed without introduction of hydrogen during formation of the polycrystalline silicon.germanium thin film, TFT was prepared similarly as in preparation of Sample A4-1 (Sample A4-2). For each of the thus prepared samples, $\mu$eff, change in $I_D$ with lapse of time, changed value $\Delta V_{TH}$ of threshold voltage were measured to obtain the results shown in Table 3-A.

As apparently seen from Table 3-A, Sample A4-1 was entirely without change in $I_D$ with lapse of time, having also a large $\mu$eff of 32 cm$^2$/V.S, thus exhibiting good transistor characteristics.

TABLE 3-A

| Sample No. | A4-1 | A4-2 |
|---|---|---|
| Partial hydrogen pressure $P_H$ (Torr) | $1 \times 10^{-4}$ | 0 |
| Hydrogen atom content (atomic %) | 1.2 | 0 |
| $\mu$eff (cm$^2$/V.S) | 32 | 8 |
| Change in $I_D$ with lapse of time (%) | $\leq 0.1$ | 1.8 |
| $\Delta V_{TH}$ (V) | 0 | 0.4 |

EXAMPLE 10

Figure 8:
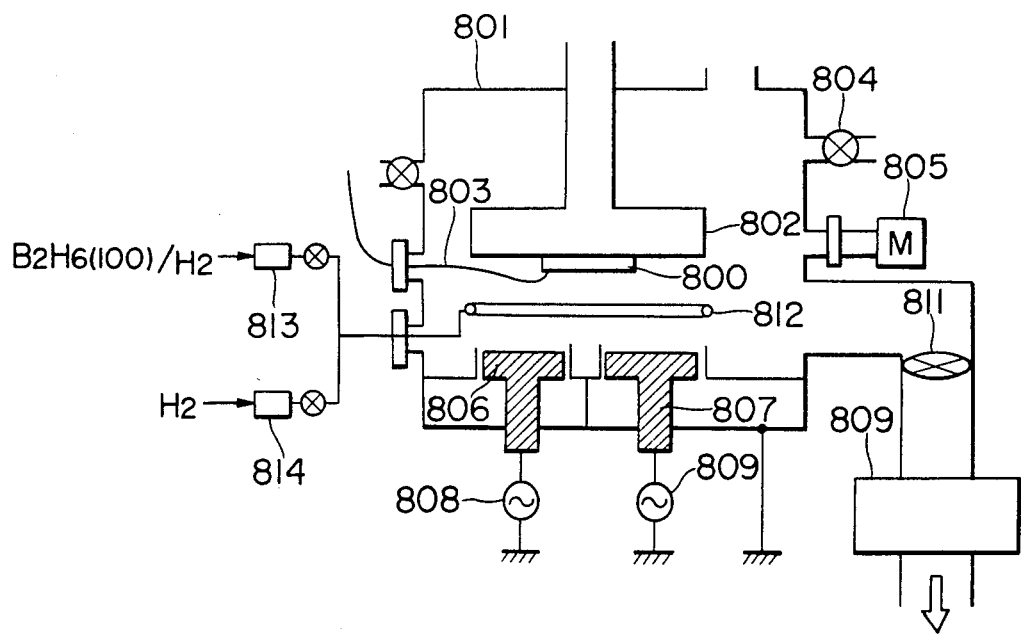

Next, an example having formed a polycrystalline silicon germanium thin film according to the sputtering method is to be described in detail by referring to FIG. 8.

A Corning #7059 glass substrate 800 prepared similarly as in Example 6 was fixed in close contact with a substrate heating holder 802 on the upper anode side in a bell-jar 801, and a polycrystalline silicon plate (not shown, purity: 99.999%) was placed on the lower cathode electrode 806 and a polycrystalline germanium plate (not shown, purity: 99.999%) was placed on the lower cathode electrode 807 so as to confront the substrate. The inner pressure in the bell-jar 801 was evacuated by means of a diffusion pump 809 to $1 \times 10^{-6}$ Torr or less, whereupon the substrate heating holder 802 was heated to maintain the surface temperature of the substrate 800 at 400° C.

B$_2$H$_6$(100)/H$_2$ gas was introduced through a mass flow controller 813 at a flow rate of 5 SCCM, and further H$_2$ gas through a mass flow controller 814 at a flow rate of 30 SCCM, through an annular gas introducing tube 812 into the bell-jar 801, and the inner pressure in the bell-jar 801 was set at 0.01 Torr by narrowing the main valve 811.

After the inner bell-jar pressure was stabilized, an output of 3.5 Kg having a high frequency of 13.56 MHz was applied by a power source 808 to the lower cathode electrode 806 and an output of 2.5 Kg having a high frequency of 13.56 MHz applied by a power source 809 to the lower cathode electrode 807 to excite glow discharging between the polycrystalline silicon plate and polycrystalline germanium plate on the cathode electrodes 806, 807 and the anode (substrate heating holder) 802 to have p-type polycrystalline silicon germanium thin film deposited on the glass substrate 800. The film formed had a thickness of 0.55$\mu$. The hydrogen atom content in the polycrystalline silicon.germanium thin film formed was 1.6 atomic %.

By use of the sample obtained, TFT was prepared according to the same method as in Example 6, and it was found to be a good TFT exhibiting stable and good transistor characteristics, with $\mu$eff of 35 cm$^2$/V.sec, change in $I_D$ with lapse of time less than 0.1% and the changed value $\Delta V_{TH}$ of threshold voltage of 0 V.

As described above in detail, the semiconductor element prepared from a base material of a polycrystalline semiconductor thin film has good electrical characteristics, without change with lapse of time, and can also improve yield and scattering of the elements. As a consequence, it is possible to provide stable displays utilizing LC, EL or EC, or scanning circuits or driving circuits such as image devices, etc.

What is claimed is:

1. A semiconductor device which includes a polycrystalline semiconductor thin film layer comprising germanium atoms as a matrix and containing 0.01 to 3 atomic % of hydrogen atoms.

2. A semiconductor device according to claim 1, wherein silicon atoms are further contained in the polycrystalline semiconductor thin film layer.

3. A semiconductor device according to claim 2, wherein the silicon and germanium atoms in the layer satisfy the relation Ge$_x$Si$_{1-x}$.

4. A semiconductor device according to claim 3, wherein x is between about 0.01 and 1.

5. A semiconductor device according to claim 4, wherein x is no less than 0.1.

6. A thin film transistor comprising:
   a substrate;
   a polycrystalline semiconductor layer provided on said substrate comprising germanium atoms as a matrix and containing 0.01 to 3 atomic % of hydrogen atoms;
   a source region and a drain region provided internally of said semiconductor layer;
   an insulating layer provided at least on the semiconductor layer at the portion between these two regions; and
   a gate electrode provided on said insulating layer, a source electrode in electrical contact with the source region and a drain electrod in electrical contact with the drain region.

7. A thin film transistor according to claim 6, wherein silicon atoms are further contained in the semiconductor layer.

8. A thin film transistor according to claim 6, wherein the substrate is a heat-resistant plastic.

9. A thin film transistor according to claim 6, wherein the substrate is a low melting glass.

10. A thin film transistor according to claim 6, wherein the substrate is a ceramic.

11. A thin film transistor according to claim 6, wherein the substrate is a hard glass.

* * * * *

UNITED STATES PATENT AND TRADEMARK OFFICE
CERTIFICATE OF CORRECTION

PATENT NO. : 4,740,829        Page 1 of 4
DATED : April 26, 1988
INVENTOR(S) : TAKASHI NAKAGIRI, ET AL.

It is certified that error appears in the above-identified patent and that said Letters Patent is hereby corrected as shown below:

AT [56] IN THE REFERENCES CITED

Other Publications, under "Kamins, et al.", "Poly-Crystalline-Silicon" should read --Polycrystalline-Silicon--.
"Proceeding of the IEEE," should read --Proceedings of the IEEE,--.

COLUMN 1

Line 56, "so called" should read --so-called--.

COLUMN 3

Line 35, "Vapour" should read --Vapor--.
Line 36, "Vapour" should read --Vapor--.
Line 37, "Vapour" should read --Vapor--.
Line 47, "H2," should read --$H_2$,--.

COLUMN 4

Line 3, "exists" should read --exist--.

COLUMN 5

Line 56, "a ultra-hard" should read --an ultra-hard--.

COLUMN 6

Line 27, "hereinafter" should read --(hereinafter "bell-jar")--.

UNITED STATES PATENT AND TRADEMARK OFFICE
CERTIFICATE OF CORRECTION

PATENT NO. : 4,740,829

DATED : April 26, 1988

INVENTOR(S) : TAKASHI NAKAGIRI, ET AL.

It is certified that error appears in the above-identified patent and that said Letters Patent is hereby corrected as shown below:

COLUMN 7

Line 64, "And,there" should read --And, there--.

COLUMN 8

Line 50, "First" should read --First,--.

COLUMN 11

Line 4, "silicon germanium" should read
        --silicon·germanium--.
    Line 16, "oxygen, nitrogen" should read
        --oxygen or nitrogen--.

COLUMN 12

Line 13, "H atmosphere." should read --$H_2$ atmosphere.--.
    Line 42, "silicon germanium" should read
        --silicon·germanium--.
    Line 50, "silicon germanium" should read
        --silicon·germanium--.
    Lines 57-59, delete boldface type.

UNITED STATES PATENT AND TRADEMARK OFFICE
CERTIFICATE OF CORRECTION

PATENT NO. : 4,740,829

DATED : April 26, 1988

INVENTOR(S) : TAKASHI NAKAGIRI, ET AL.

It is certified that error appears in the above-identified patent and that said Letters Patent is hereby corrected as shown below:

COLUMN 13

Line 32, "shutters 507" should read --shutters 507 and 512--.
Line 32, "silicon germa-" should read --silicon·germa---.
Line 38, "salled" should read --identified--.
Line 47, "silicon.germanium" should read --silicon·germanium--.
Line 50, "silicon germanium" should read --silicon·germanium--.
Line 51, "called" should read --identified--.
Line 53, "taining" should read --tained--.
Line 53, "silicon germanium" should read --silicon·germanium--.
Line 60, "silicon germanium" should read --silicon·germanium--.
Line 61, "so small as" should be deleted.

COLUMN 14

Table 2-A, line 21, "$\Delta V_{TH}$" should read --$\Delta V_{TH}(V)$--.
Line 26, "silicon" should read --silicon·--.
Line 31, "another" should read --a--.
Line 31, "a" should read --another--.
Line 58, "silicone germanium" should read --silicon·germanium--.

UNITED STATES PATENT AND TRADEMARK OFFICE
CERTIFICATE OF CORRECTION

PATENT NO. : 4,740,829

DATED : April 26, 1988

INVENTOR(S) : TAKASHI NAKAGIRI, ET AL.

It is certified that error appears in the above-identified patent and that said Letters Patent is hereby corrected as shown below:

COLUMN 15

Line 19, "silicon germanium" should read --silicon·germanium--.
Line 52, "silicon germanium" should read --silicon·germanium--.

COLUMN 16

Line 43, "electrod" should read --electrode--.

Signed and Sealed this

Eleventh Day of April, 1989

Attest:

DONALD J. QUIGG

Attesting Officer

Commissioner of Patents and Trademarks